United States Patent [19]

Shigeta

[11] 4,103,242

[45] Jul. 25, 1978

[54] WAVEFORM CONVERTER FOR ALTERING THE FREQUENCY SPECTRUM OF AN OUTPUT SIGNAL

[75] Inventor: Junnosuke Shigeta, Hirakata, Japan

[73] Assignee: Matsushita Electric Industrial Co., Ltd., Osaka, Japan

[21] Appl. No.: 685,134

[22] Filed: May 11, 1976

[30] Foreign Application Priority Data

May 15, 1975 [JP] Japan ................................ 50-58015

[51] Int. Cl.$^2$ ........................ H03K 5/08; G06G 7/18
[52] U.S. Cl. ........................................ 328/35; 84/1.01; 307/261; 328/127
[58] Field of Search ........ 307/228, 261, 268, 106–108; 328/35, 36, 181, 127; 84/1.01

[56] References Cited

U.S. PATENT DOCUMENTS

| | | | |
|---|---|---|---|
| 2,511,564 | 6/1950 | Callan | 328/127 |
| 3,039,059 | 6/1962 | Fisher | 328/127 |
| 3,128,394 | 4/1964 | Bianchi | 328/127 |
| 3,252,098 | 5/1966 | Schlaepfer | 328/127 |
| 3,603,809 | 9/1971 | Uchiyama | 328/35 |
| 3,617,598 | 11/1971 | Woody, Jr. | 84/1.01 |
| 3,675,137 | 7/1972 | Raphael | 328/127 |
| 3,723,762 | 3/1973 | Nakaya | 307/228 |

*Primary Examiner*—Stanley D. Miller, Jr.
*Attorney, Agent, or Firm*—Stevens, Davis, Miller & Mosher

[57] ABSTRACT

A waveform converter adapted for use in generating a music tone in an electronic musical instrument such as an electronic organ is disclosed. The frequency spectrum of an output signal waveform is periodically or transiently changed by changing pulse duration or duty factor of an input square wave.

4 Claims, 5 Drawing Figures

WAVEFORM CONVERTER FOR ALTERING THE FREQUENCY SPECTRUM OF AN OUTPUT SIGNAL

BACKGROUND OF THE INVENTION

FIELD OF THE INVENTION

The present invention relates to a waveform converter adapted for use in generating a music tone in an electronic musical instrument such as an electronic organ, wherein the frequency spectrum of the output signal waveform can be readily changed periodically or transiently by changing the pulse duration or duty factor of an input square wave.

SUMMARY OF THE INVENTION

It is an object of the present invention to provide a waveform converter which has the function of differential tracking the change of an input square wave from a low potential to a high potential and the function of integration tracking the change of an input square wave from the high potential to the low potential, or vice versa, whereby the pulse duration or duty factor of the input square wave may be changed to periodically or transiently alter the frequency spectrum of the output signal waveform.

BRIEF DESCRIPTION OF THE DRAWINGS

The above and other objects, features and advantages of the invention will become more apparent from the following detailed description of preferred embodiments of the invention when taken in conjunction with the accompanying drawings.

DESCRIPTION OF THE PREFERRED EMBODIMENTS

Figure 1:
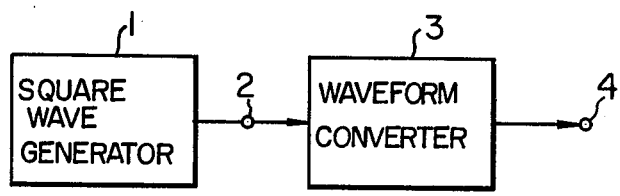
FIG. 1 is a block diagram illustrating a basic principle of the present invention.

Now referring to FIG. 1, a block diagram for illustrating the basic principle of the present invention is shown. In FIG. 1, a square wave generator 1 produces at a terminal 2 a square wave voltage shown as A in FIG. 2 having a duty factor and a period T. A waveform converter 3 of the present invention produces at an output terminal 4 a waveform shown as (B) in FIG. 2 having the period T.

The operation of FIG. 1 is as follows. When the output of the square wave generator 1 changes from a low potential $E_1$ to a high potential $E_2$ at the time O, the waveform converter 3 having its input terminal connected to the terminal 2 follows the rising transient of the potential with a differentiation function. This is shown as $\alpha$ in waveform (B) of FIG. 2. When the waveform to the waveform converter 3 falls from the high potential $E_2$ to the low potential $E_1$ at the time $t_1$, the output waveform of the waveform converter 3 follows the falling transient with an integration function shown as $\beta$ in waveform (B) of FIG. 2 which abuts $\alpha$ at a potential K in waveform (B).

When the input voltage to the waveform converter 3 again changes from the low potential $E_1$ to the high potential $E_2$ at the time T, the previously described operation is repeated.

Figure 2:
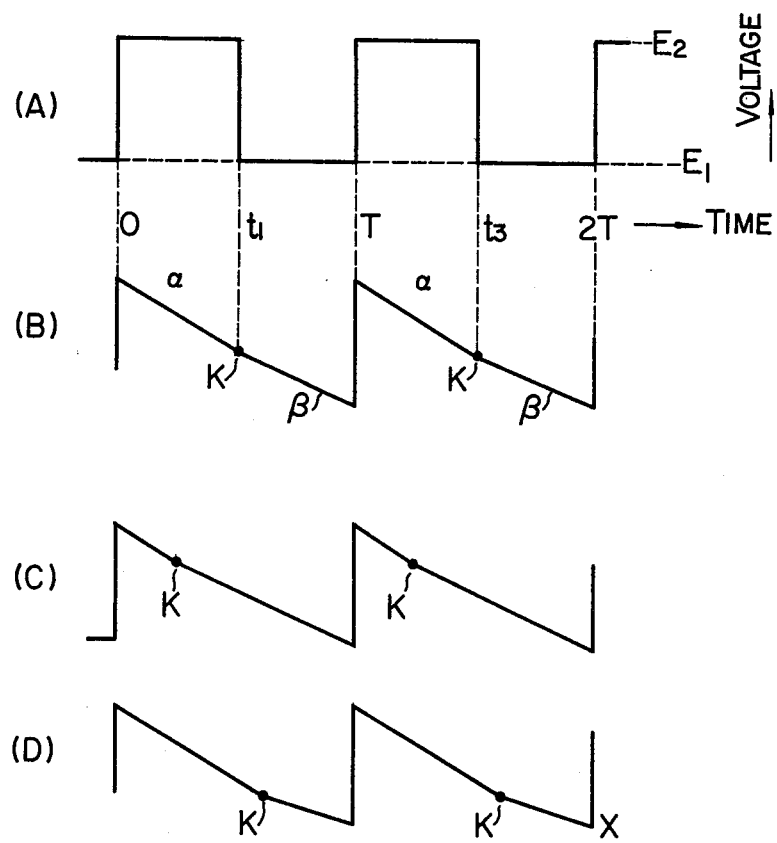
FIG. 2 shows signal waveforms for explaining the operation thereof.

It is thus apparent from waveforms (A) and (B) in FIG. 2 that waveform converter 3 functions with differential tracking for the change of the input square wave from the low potential to the high potential (rising transient) and it functions with integration tracking for the change of the input square wave from the high potential to the low potential (falling transient). It should be understood that waveform converter 3 may also be arranged to operate in an inverse manner, such that it functions with differential tracking for the change of the input square wave from the high potential to the low potential (falling transient) and functions with integration tracking for the change of the input square wave from the low potential to the high potential (rising transient).

With the above arrangement of the waveform converter, if waveform (A) in FIG. 2 is imparted with a pulse width modulation, for example, between times O and $t_1$ and T and $t_3$, and if the circuit arrangement is designed such that the gradients, shown as $\alpha$ and $\beta$ are different, the output waveform of the present waveform converter may be varied as shown by waveforms (C) and (D) in FIG. 2. Accordingly, when pulse width modulation of the input waveform is effected periodically or transiently, the frequency spectrum of the converted waveform may be varied periodically or transiently.

The period of the waveform generated by the present waveform converter 3 is always identical to the period of the input waveform applied thereto.

Figure 3:
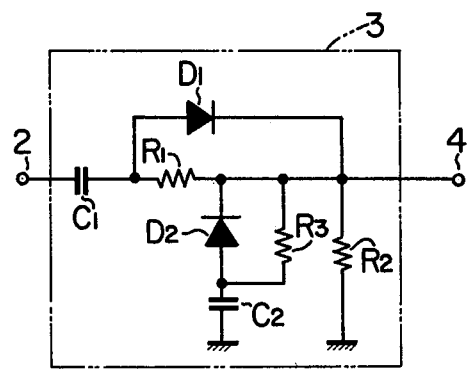
FIGS. 3 and 4 are circuit diagrams of specific embodiments of the present invention.
Figure 4:
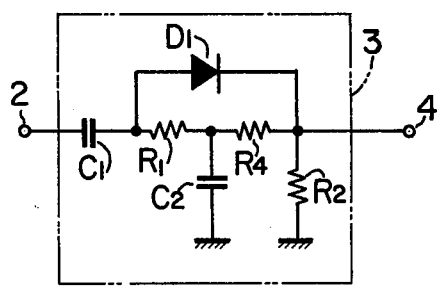

FIGS. 3 and 4 show circuit diagrams of specific embodiments of the present invention. Referring first to FIG. 3, when the waveform shown as (A) in FIG. 2 is applied to terminal 2, a voltage change of $(E_2 - E_1)$ is developed at the anode of a diode $D_1$ through a capacitor $C_1$. Since this anode potential $E_2 - E_1$ is positive and it is more positive than the potential at the cathode, which is biased to the ground voltage (0 V.) through a resistor $R_2$, the diode $D_1$ is conducting. If the internal resistance of the diode $D_1$ can be neglected, it follows that resistor $R_1$ is substantially short-circuited, resulting in the formation of a differentiating circuit comprising the capacitor $C_1$ and the resistor $R_2$. As a result, a differentiated waveform shown as $\alpha$ in waveform (B) of FIG. 2 is produced. After the time O, the anode potential of diode $D_2$ is at a fractional value of the output potential as determined by a resistor $R_3$ and an integrating capacitor $C_2$. If the resistor $R_3$ is chosen to be sufficiently larger than the resistor $R_2$, $(R_3 >> R_2)$, diode $D_2$ is cut off by the voltage $(E_2 - E_1) - (t/C_1R_2)$ which appears at the output of the differentiating circuit comprising $C_1$ and $R_2$, or, in other words, the output terminal 4, such that a parallel connection of the capacitor $C_2$ and the resistor $R_2$ is substantially prevented. When the potential changes from $E_2$ to $E_1$ at the time $t_1$ shown in waveform (B) of FIG. 2, the voltage change of $-(E_2 - E_1)$ is developed at the anode of diode $D_1$ through capacitor $C_1$ so that diode $D_1$ is reverse biased to open the shortcircuit across resistor $R_1$. If $R_1$ is chosen such that the time constant $C_1 \times R_1$ is sufficiently larger than the period of the input signal, the voltage change at the output terminal 4 after time $t_1$ approaches $-(E_2 - E_1) \times (R_2/R_1 + R_2)$, but after the time $t_1$ diode $D_2$ which has been cut-off conducts because at time $t_1$ the charged voltage at the anode of the diode $D_2$ which has been acting in the differentiation mode becomes positive with respect to the cathode voltage of diode $D_1$ which corresponds to $-(E_2 - E_1) \times (R_2/R_1 + R_2)$. As a result, the capacitor $C_2$ is inserted in parallel with resistor $R_2$ as an integration element so that the output signal waveform appearing at output terminal 4 is the integrated waveform shown as $\beta$ in waveform (B) of FIG. 2.

The waveform converter 3 repeats the operations taking place in the period O to T after the time T or, in other words, after the elapse of one cycle of the input signal. Resistor $R_3$ functions to bias diode $D_2$ and during the differentiation mode or operation it functions to cause capacitor $C_2$ to store the voltage at output terminal 4.

FIG. 4 shown an embodiment which is adapted to be used as a musical tone signal waveform converter for an electronic musical instrument. This embodiment is a less expensive version of the circuit of FIG. 3 which retains the basic principles of operation for the waveform generator of FIG. 1. A resistor $R_4$ is added to prevent any adverse effects which might be caused by the capacitor $C_2$ during the differentiation mode of operation.

In both FIGS. 3 and 4, a differentiation operation is carried out for the rising transient of the input square wave applied to terminal 2 and an integration operation is carried out for the falling transient. When it is desired to effect the integration operation for the rising transient and the differentiation operation for the falling transient, the diodes $D_1$ and $D_2$ in FIGS. 3 and 4 may be connected in inverse manner with respect to the illustrated connection. In either case, the circuit is arranged such that terminal 2 leads to the series connection of differentiating capacitor $C_1$ and a branching circuit comprising diode $D_1$ and resistor $R_1$, which series connection is in turn connected in series with output resistor $R_2$; integrating capacitor $C_2$ is connected in a branch which includes resistor $R_1$ or in parallel with output terminating resistor $R_2$. Resistor $R_2$ may be constructed to include an input impedance of a succeeding stage to be connected to output terminal 4.

Figure 5:
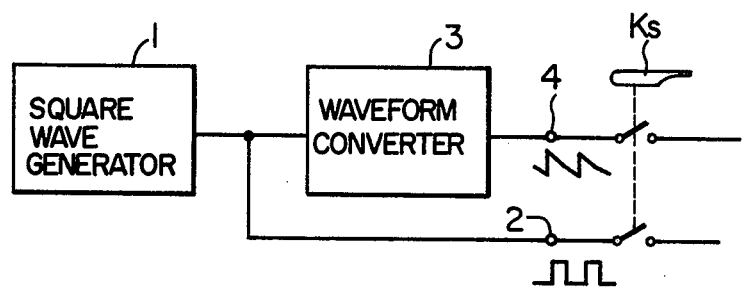
FIG. 5 shows a block diagram of a main section of an application of the present invention.
Figure 5:
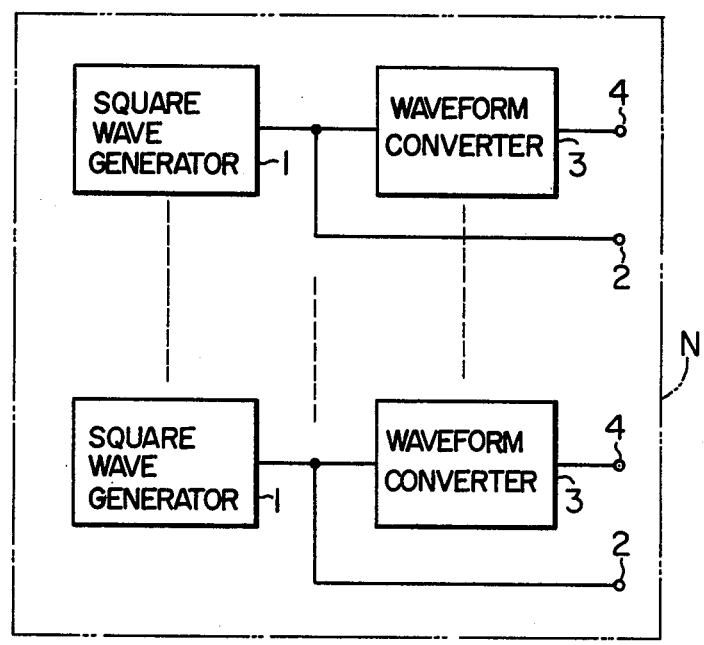

FIG. 5 is a block diagram illustrating one application of the present invention, in which a set of waveform converters 3, constructed in the manner described above are shown as being enclosed by box N. The number of waveform converters 3, for example, corresponding to the number of keyboard switches KS in an electronic musical instrument. In this arrangement, the input signals to waveform converters 3 can also be used as musical tone signals along with the output signals from waveform converters 3 so that musical signals of different tones can be derived in two channels. Furthermore, by applying pulse width modulation to square wave generator 1, both signal waveforms at terminals 2 and 4 can be modulated to change the frequency spectra. In this manner, an effective tone generator system for the electronic musical instrument can be attained.

As is apparent from the above description of preferred embodiments, the present invention can readily produce an output signal waveform in which the frequency specturm changes periodically or transiently, in accordance with a change in the pulse duration or duty factor of the input square wave by using a relatively simple circuit configuration.

What is claimed is:
1. A waveform converter comprising:
an input terminal, an output terminal and a ground,
a first capacitor having one end connected to said input terminal and the other end connected to one end of a first resistor, the other end of said first resistor being connected to said output terminal,
a first switching device connected between said one end of said first resistor and said output terminal,
a second resistor connected between said output terminal and said ground,
a second switching device connected in parallel with a third resistor, one end of said parallel connection being connected to said output terminal,
a second capacitor connected between the other end of said parallel connection and ground,
one of said first and second switching devices being rendered conductive and the other being rendered non-conductive in response to a change of a square wave signal applied to said input terminal from a first to a second potential and said other of said switching devices being rendered conductive and said one of said switching devices being rendered non-conductive in response to a change of said square wave input signal from said second to said first potential, whereby said first capacitor and said second resistor substantially constitutes a differentiating circuit and said first resistor and said seacond capacitor substantially constitutes an integration circuit.

2. A waveform converter according to claim 1 wherein said first and second switching devices are diodes.

3. A waveform converter comprising:
an input terminal, an output terminal and a ground,
a first capacitor having one end connected to said input terminal and the other end connected to one end of a first resistor, the other end of said first resistor being connected to one end of a second resistor, the other end of said second resistor being connected to said output terminal,
a weitching device connected between said one end of said first resistor and said output terminal,
a third resistor connected between said output terminal and ground,
a second capacitor connected between said other end of said first resistor and ground,
said switching device being rendered conductive in response to a change of a square wave input signal applied to said input terminal from a first to a second potential whereby said first capacitor and said third resistor substantially constitutes a differentiating non-conductive in response to a change of said square wave intput signal from said second to said first potential, whereby said first resistor and siad second capacitor substantially contitutes and integration circuit.

4. A waveform converter according to claim 3 wherein said switching device is a diode.

* * * * *